United States Patent [19]
Johnson

[11] Patent Number: 5,766,978
[45] Date of Patent: Jun. 16, 1998

[54] PROCESS FOR TESTING AN INTEGRATED CIRCUIT PACKAGE USING AN INTEGRATED CIRCUIT PACKAGE RETAINER

[75] Inventor: Kenneth W. Johnson, Colorado Springs, Colo.

[73] Assignee: Hewlett-Packard Company, Palo Alto, Calif.

[21] Appl. No.: 641,243

[22] Filed: Apr. 30, 1996

Related U.S. Application Data

[63] Continuation-in-part of Ser. No. 592,468, Jan. 26, 1996, Pat. No. 5,680,057.

[51] Int. Cl.$^6$ .......................... H01L 21/52; H01L 21/58; H01L 21/603; H01L 21/66
[52] U.S. Cl. .................. 438/15; 438/18; 438/117
[58] Field of Search .................. 437/8; 438/15, 438/18, 117

[56]        References Cited

U.S. PATENT DOCUMENTS

| | | | |
|---|---|---|---|
| 3,678,385 | 7/1972 | Bruner | 324/158 F |
| 4,411,719 | 10/1983 | Lindberg | 156/64 |
| 5,049,813 | 9/1991 | Van Loan et al. | 324/158 F |
| 5,137,836 | 8/1992 | Lam | 437/8 |
| 5,159,266 | 10/1992 | Appold | 324/158 F |
| 5,396,032 | 3/1995 | Bonham, Jr. et al. | 174/52.4 |

*Primary Examiner*—David Graybill
*Attorney, Agent, or Firm*—Patrick J. Murphy

[57]         ABSTRACT

A method for testing leads of an integrated circuit package. The method includes a testing substrate with a plurality of conductive portions for use in connection with a test probe. The method further includes at least one compressible conductive bridge member for providing electrical contact between the leads of the integrated circuit package and the conductive portions of the testing substrate. The conductive bridge member has multiple electrically conductive wires embedded therein or secured thereto, each of the wires being parallel to one another and spaced apart from one another. The method uses a frame for retaining the conductive bridge members therein and maintaining the conductive bridge members in electrical contact with the leads of the integrated circuit package and the conductive portions of the testing substrate. The method for attaching the test probe to the circuit package includes the steps of affixing a retainer to the top side of the package and hooking a probe up to the package via the retainer.

3 Claims, 5 Drawing Sheets

PROCESS FOR TESTING AN INTEGRATED CIRCUIT PACKAGE USING AN INTEGRATED CIRCUIT PACKAGE RETAINER

This application is a continuation-in-part of application Ser. No. 08/592,468, filed on Jan. 26, 1996, now U.S. Pat. No. 5,680,057.

FIELD OF THE INVENTION

The present invention relates generally to electronic test equipment and more particularly to a test probe assembly and method for electrically connecting the leads of an integrated circuit package to an electronic measurement device.

BACKGROUND OF THE INVENTION

Integrated circuit (IC) packages are typically comprised of an insulated housing with a plurality of lead connectors extending outwardly from the housing. One common IC package is the dual in-line package (DIP) in which electrical leads are brought out along two sides of the housing. Another common IC package is the quad flat package (QFP) in which the leads are brought out along four sides. The leads may be bent to a number of configurations for surface mounting on printed circuit boards; "gull-wing" is one of the more common bent lead configurations.

Electronic test equipment (e.g., oscilloscope, logic analyzer, emulator) is used to analyze various electrical aspects of the IC including voltage and current waveforms. Typically, a loaded printed circuit board is crowded with various electrical components, including multiple IC packages. Due to the close spacing of components on the board (i.e., high "board density"), as well as the small size and pitch of each IC package lead, it is often difficult to manipulate each lead with a test probe to electrically connect each lead to the test equipment.

One common method for circuit testing involves connecting individual test probes to individuals IC leads. Another method involves a "test clip," which commonly includes a spring-tensioned lead portion which "clips" onto an IC package to hold the circuit testing device leads firmly against the IC package leads. Typically, the circuit testing device leads in a test clip are not insulated from one another so that extreme care must be taken to prevent misalignment which can result in a shorted electrical connection between the circuit testing device leads. Another problem with test clips is that they tend to have a much larger footprint than the IC package to be tested; this increases the chance that the test clip will interfere with adjacent components during testing.

Examples of test clips may be found in the 1993 Pomona Surface Mount & IC Test Accessories catalog, by ITT Pomona Electronics, 1500 E. Ninth St., Pomona, Calif. 91769, which is incorporated herein by reference for all that is contained therein. As shown in the catalog, to select the right test clip, the following characteristics of the integrated circuit package to be tested must be determined: number of leads; package configuration (number of sides); lead pattern (e.g., 4×4, 7×7, 16×24, etc.); lead spacing; package type (e.g. DIP, PLCC, SOIC, QFP, etc.); standard (EIAJ or JEDEC); footprint; and interface (top side interconnection method). Using a test clip with characteristics that do not exactly match those of the integrated circuit package may result in electrical shorts or opens. Thus, test clips may not be available for certain integrated circuit packages which do not have industry-standard (i.e. EIAJ or JEDEC) characteristics. Furthermore, allowable tolerances in commercial products are sufficiently variable so that differences between manufacturers, or even between different plants of the same manufacturer, may require different test clips for devices with the same part number. For example, the leads of integrated circuit packages may be bent differently, the packages may be manufactured to English or Metric standards, or the housing portions of the packages may vary in size and/or shape. Finding a test clip for a particular integrated circuit package may therefore be difficult or impossible. Likewise, a test clip which matches the characteristics of a particular integrated circuit package may not be usable on another integrated circuit package with slightly different characteristics.

One problem that is common to both individual test probes and test clips is that the IC package leads are contacted either on the "foot" of the leads, where the leads are soldered to a printed circuit board, or on the angled portion that ramps down to the foot. These two areas on the package leads are either poorly defined and controlled or susceptible to change during processing and handling.

SUMMARY OF THE INVENTION

The present invention may comprise an assembly for testing the leads of an integrated circuit package. The assembly may comprise a testing substrate for use in connection with a test probe, the testing substrate comprising a plurality of conductive portions. The conductive portions may comprise a plurality of elongate conductive pins secured to the testing substrate and extending outwardly therefrom.

The assembly may also comprise conductive bridge means for providing electrical contact between the leads of the integrated circuit package and the conductive portions of the testing substrate. The conductive bridge means may comprise at least one compressible bridge member having a plurality of electrically conductive wires embedded therein or secured to the surface of the bridge member, the wires being substantially parallel to one another and spaced apart from one another. The assembly may further comprise frame for retaining the conductive bridge means therein and maintaining the conductive bridge means in electrical contact with the leads of the integrated circuit package and the conductive portions of the testing substrate. The frame may comprise mounting means for mounting the assembly to a circuit board. The frame may also comprise at least one elongate opening therethrough, each opening having a bridge member positioned therein.

The present invention may also comprise a conductive bridge apparatus for providing electrical contact between leads of an integrated circuit package and conductive portions of a testing substrate. The conductive bridge apparatus may comprise an elongate insulating member comprised of compressible material. A plurality of electrically conductive wires may be embedded within the insulating member which are substantially parallel to one another and spaced apart from one another within the insulating member.

The present invention may further comprise a method for testing the leads of an integrated circuit package on a circuit board. The method may comprise the steps of: (a) adhering a retainer to the top of an IC package via a locator tool and (b) electrically coupling test equipment to the IC package via the retainer.

DETAILED DESCRIPTION OF THE PREFERRED EMBODIMENT

Briefly, the present invention provides an apparatus and method for testing integrated circuit (IC) packages. A retainer and locator tool are provided to facilitate testing. The locator tools assists in aligning and attaching the retainer to the top of the IC package which, in turn, facilitates alignment of a test probe and prevent the probe from being disturbed during test operations.

Figure 1A:
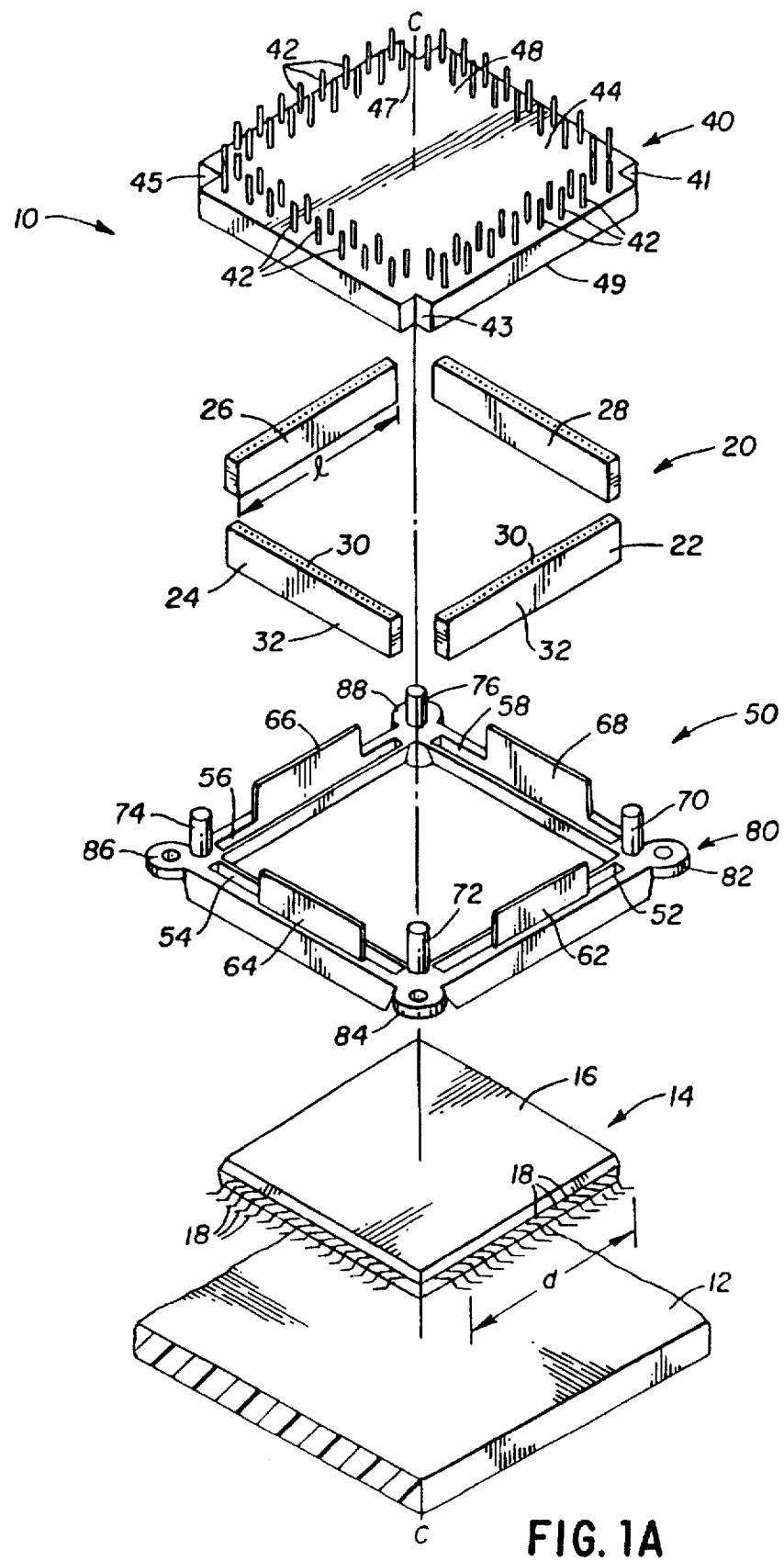
FIG. 1a is an exploded, perspective view of a first embodiment of the circuit testing assembly according to the present invention.

FIG. 1a illustrates the circuit testing assembly 10 of the present invention. A portion of a printed circuit board 12, as well as an exemplary integrated circuit package 14, are also shown. The integrated circuit package 14 may be comprised of integrated circuits (not shown) packaged inside an insulated housing 16, with a plurality of thin, substantially parallel electrical leads 18 extending outwardly from the housing 16. The leads 18 can be made of beryllium copper and gold- or tin-plated, for example. In a preferred embodiment, the IC package 14 is a quad flat pack (QFP) which is rectangular, each side being approximately 32 millimeters in length. Other sizes are available, depending upon the QFP type. The QFP may be any one of generally well-known QFPs, including a ceramic QFP, a metal and ceramic QFP, a plastic QFP or a fine pitch QFP. In one embodiment, the QFP has 240 electrical leads, 60 leads on a side, with a spacing between the leads being approximately 0.65 mm. Other IC sizes, shapes and package configurations (e.g., dual in-line packages), may be used without departing from the scope of the present invention. For example, the IC package 14 may have 160 pins (i.e., leads), 208 pins or other number of pins extending outwardly from the housing 16. The IC package 14 may be attached to the PCB 50 using conventional soldering techniques. A central longitudinal axis CC passes through the geometric center of the integrated circuit package 14 and the geometric center of the circuit testing assembly 10 as shown in FIG. 1.

The circuit testing assembly 10 of the present invention may comprise a conductive bridge means 20 for providing electrical contact between the integrated circuit package leads 18 and a testing substrate 40. The conductive bridge means 20 includes at least one, and preferably four, compressible bridge members 22, 24, 26, 28. Each bridge member 22, 24, 26, 28 comprises a plurality of substantially parallel, electrically conductive wires 30 embedded within a compressible insulating member 32. The wires 30 are each positioned in substantially parallel relationship to one another and to the central longitudinal axis CC, and are preferably constructed of gold-plated brass. Furthermore, the wires 30 are spaced apart from each other as shown, and may be molded directly into the member 32 during the production thereof The insulating member 32 is preferably constructed from a flexible, deformable elastomeric material such as silicone rubber although other compressible materials could be used without departing from the scope of the present invention.

Figure 2:
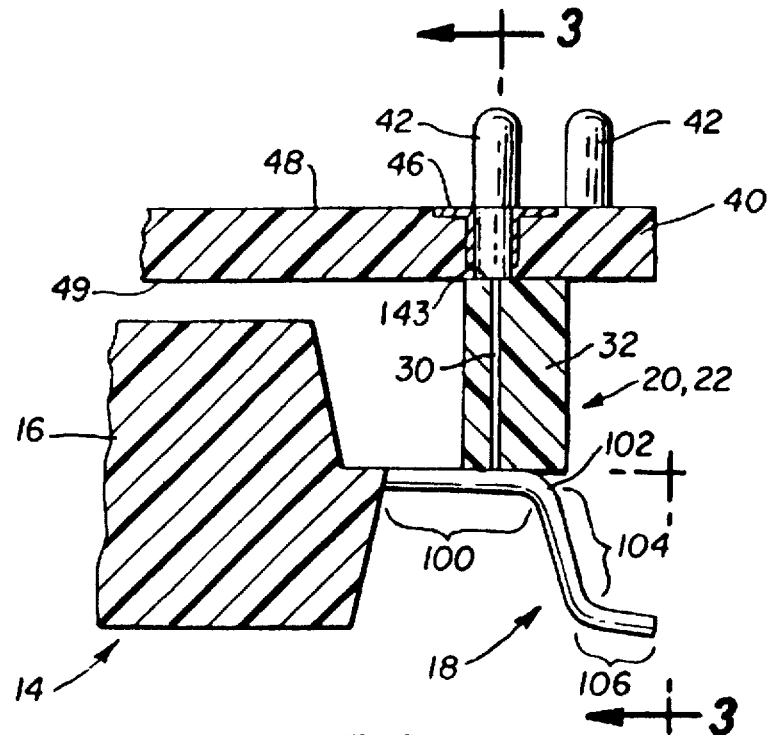
FIG. 2 is a side, enlarged, sectional view of an integrated circuit package lead in association with the circuit testing assembly of FIG. 1.
Figure 3:
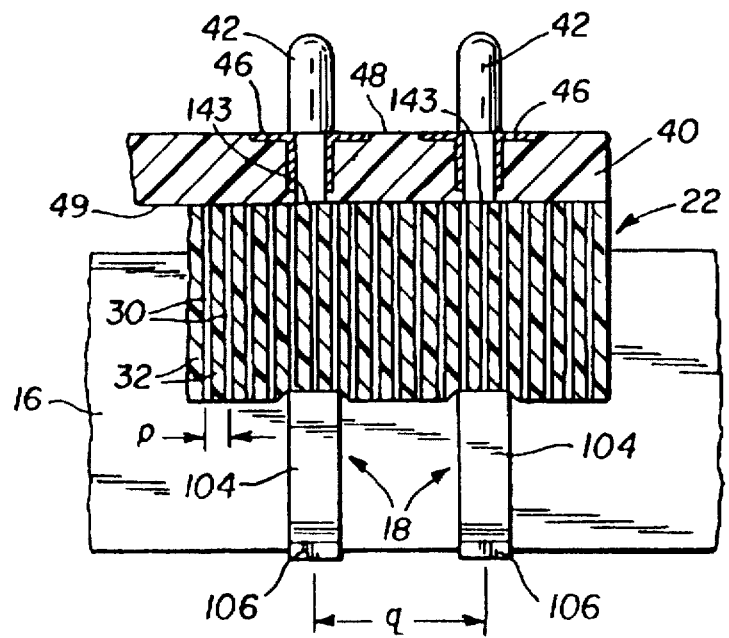
FIG. 3 is a front, enlarged, sectional view of two integrated circuit package leads in association with the circuit testing assembly of FIG. 1 taken along lines 3—3 of FIG. 2.

Still referring to FIG. 1, a frame 50, which is preferably constructed from plastic, is provided for housing the conductive bridge means 20 so that electrical contact between the integrated circuit package leads 18 and the testing substrate 40 may be provided by the conductive bridge means 20. More specifically, the frame 50 comprises retaining portions 52, 54, 56, 58 located around the periphery of the frame 50 as shown in FIG. 1. Each bridge member 22, 24, 26, 28 is positioned within a retaining portion 52, 54, 56, 58, respectively, of the frame 50. Each retaining portion 52, 54, 56, 58 is preferably in the form of a linear, bar member having an elongate, slot-like opening which passes entirely through the frame 50. The testing substrate 40, which is preferably constructed from plastic, is positioned within the frame 50 directly above and adjacent to the conductive bridge means 20, and comprises a plurality of electrically conductive portions 42 which extend from the bottom surface 49, through the testing substrate 40, and outwardly from the top surface 48 of the testing substrate 40 (FIGS. 1 and 3). The electrically conductive portions 42 may comprise conventionally-known pins or the like which may be positioned within a seat portion 46 as shown in FIGS. 2 and 3. The conductive portions 42 may be ultimately used as electrical terminals which are easily placed in contact with a test probe (not shown) due to the large size of such portions 40 compared to the integrated circuit package leads 18. Although a dual-row, perimeter pin array is shown in FIG. 2, an area array or various other pin patterns could also be used.

Figure 1B:
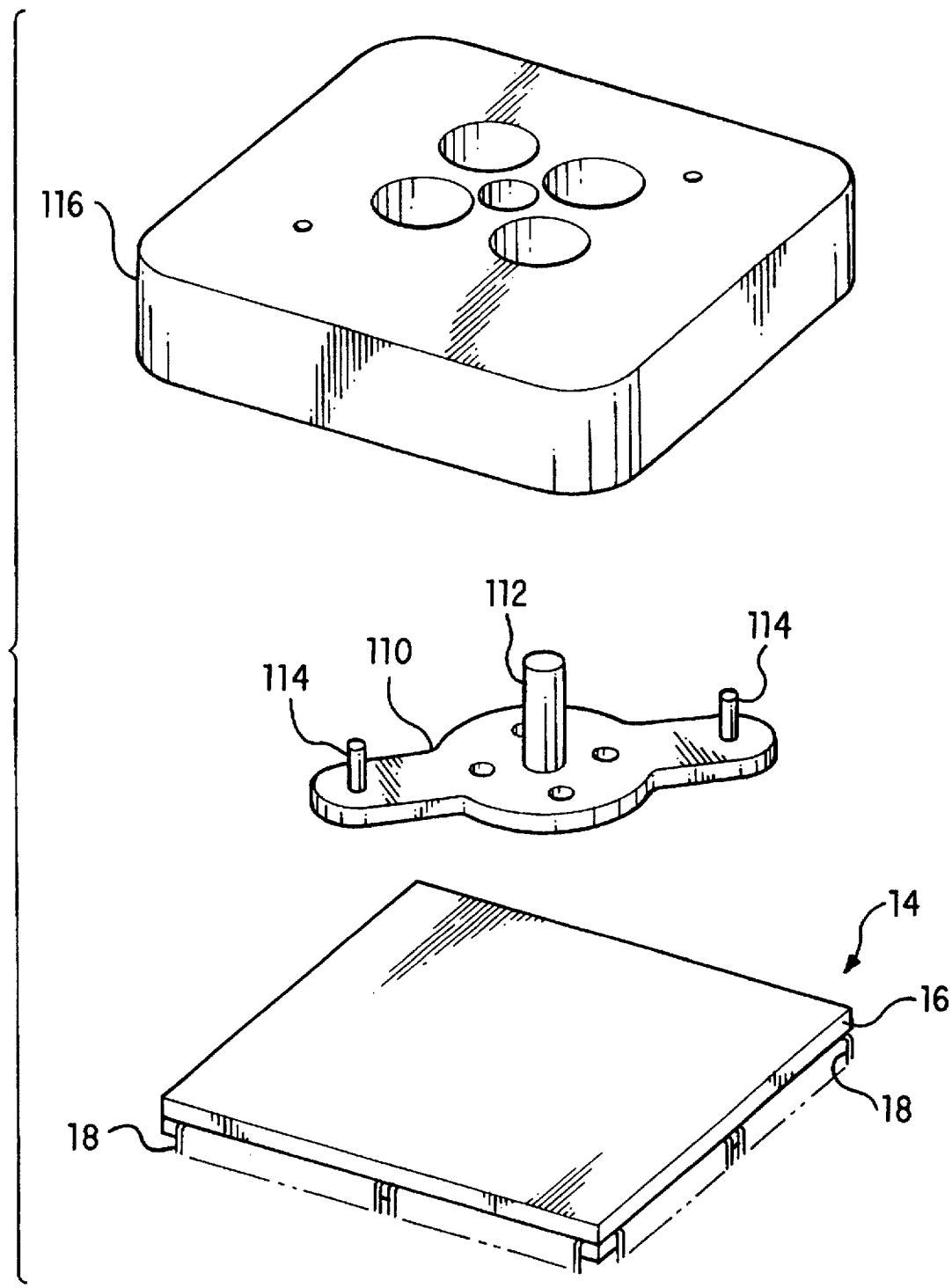
FIG. 1b shows a locator according to the present invention.

Refer now to FIG. 1b which shows a locator 116. The locator 116 is not part of the circuit test assembly. Rather, it is an apparatus which facilitates placement of a retainer 110 upon the IC package 14. The locator 116, which is preferably formed of plastic, has at least three apertures which correspond to the center stud 112 and alignment pins 114 of the retainer 110. Although the alignment pins 114 are illustrated as having equivalent diameters, the present invention contemplates having different diameters for the alignment pins 114. The perimeter of the locator 116 is slightly larger than the perimeter of the IC package 14 so that, with the retainer 110 placed within the locator 116, one is able to centrally position the retainer 110 on the top-side of the IC package 14. In one preferred embodiment, the retainer is made from metal. Another embodiment contemplates using a plastic retainer.

Not illustrated are corner guides, molded to fit the four corners of the IC package, and guide teeth stubs, molded to fit between leads of the IC package, are provided to facilitate proper alignment of the locator 116 on to the IC package. The guide teeth, which are preferable placed adjacent to and on either side of the corner guides, can also be placed anywhere along each of the four sides of the locator 116. The corner guides extend to the bottom of the locator such that they engage the corner legs of the IC package first, essentially performing a preliminary alignment with the IC package. With this accomplished, the guide teeth stubs can then only fit into the spaces between the proper IC package leads as the locator 116 moves further down onto the IC package to ensure absolutely correct alignment of the retainer 110. Once the retainer 110 is affixed to the top of the IC package 14, it serves as an alignment and support device for a test probe that will be brought into electrical contact with the leads of the IC package 14 via the circuit test assembly 10.

As illustrated in FIGS. 1–3, when the bridge members 22, 24, 26, 28 are positioned within the retaining portions 52, 54, 56, 58, the bridge members 22, 24, 26, 28 are located directly above and adjacent to the integrated circuit package leads 18, and directly below and adjacent to the electrically conductive portions 42 of the testing substrate 40. In this manner, when the entire system of FIG. 1 is assembled, the conductive bridge means 20 maintains electrical contact between the integrated circuit package leads 18 and the electrically conductive portions 42 of the testing substrate 40.

The frame 50 may also comprise posts 70, 72, 74, 76 (FIG. 1) or the like which may abut against corner portions 41, 43, 45, 47 of the testing substrate 40 with a precision-fit type of engagement. These posts 70, 72, 74, 76 assist in aligning the testing substrate 40 within the frame 50 so that the testing substrate 40 may be compressively held against the bridge means 20. The frame 50 may further comprise a plurality of planar members 62, 64, 66, 68, which securely retain the testing substrate 40 in a proper orientation, compressively held against the bridge means. The planar members 62, 64, 66, 68 may comprise tabs (not shown) or the like so that the testing substrate 40 may be snap-fit into place and held by the tabs to maintain the substrate 40 under pressure and to thus compress the bridge means between the substrate 40 and the circuit package leads 18. Various other hold-down devices for providing the compression holding may also be employed such as clamping members, screws, etc. The planar members 62, 64, 66, 68 also abut against the bridge members 22, 24, 26, 28 and assist in securely retaining the bridge members 22, 24, 26, 28 in a proper orientation within the frame 50 so that the wires 30 are maintained in a substantially parallel orientation with the central longitudinal axis CC.

The foregoing components of the circuit testing assembly 10 may be temporarily or permanently mounted to the circuit board 12 in a conventional manner. In a preferred embodiment as shown in FIG. 1, the frame 50 may further comprise annular, tab-like mounting means 80 for mounting the circuit testing assembly 10 to the circuit board 12. The tab-like mounting means 80 may further comprise mounting portions 82, 84, 86, 88 located on the corners of the frame 50 as shown in FIG. 1. The mounting portions 82, 84, 86, 88 may comprise bores as shown for receiving a screw or the like which may then be driven into corresponding bores or bosses (not shown) in the circuit board 12. In one procedure for mounting the frame 50 on the circuit board 12, the frame 50 is initially placed on the board 12 in circumscribing relationship with the integrated circuit package 14. The frame-like frame 50 is configured to closely receive the integrated circuit package 14 therewithin. Bores in mounting portions 82, 84, 86, 88 are then used as templates for drilling bores (or locating and gluing pre-drilled bosses or the like) (not shown) into circuit board 12. Finally, screws (not shown) are used to secured the frame 50 to the circuit board 12. Alternatively, the frame 50 may be permanently glued to the circuit board 12.

The integrated circuit package leads 18 may be of a type known in the art as "gull-wing" leads. As shown in FIG. 2, each "gull-wing" lead 18 comprises a first portion 100 where the lead 18 exits the housing 16 of the integrated circuit package 18, a second portion 102 (commonly referred to as the "knee") where the lead 18 bends downwardly, a third portion 104 just below the knee, and a fourth portion 106 (commonly referred to as the "foot") where the lead 18 contacts a circuit board (e.g. element 12, FIG. 1). In a preferred embodiment as shown in FIG. 2, each wire 30 of the bridge member 22 contacts the first portion 100 of one of the leads 18. In alternative embodiments (not shown), the wires 30 may contact other portions of the lead 18 such as the foot 106. As shown in FIGS. 2 and 3, each wire 30 of the bridge member 22 also contacts the bottom surface 143 of the electrically conductive portions 42.

As described above, previously known test clips comprise a spring-tensioned lead portion which uses lateral force to maintain contact between the test clip leads and the integrated circuit package leads. Such spring-tensioned leads are susceptible to bending and misalignment and also occupy a relatively large amount of lateral space. Conversely, the conductive bridge means 20 of the present invention uses compressive force to maintain contact with the integrated circuit package leads 18. This compressive force is provided in part by the testing substrate 40 pushing down on the resilient conductive bridge means 20 as shown in FIGS. 2 and 3 when the testing substrate 40 is securely, compressively held within the frame (removed from these figures for clarity) as previously described with reference to FIG. 1. This compressive force is also provided by mounting the frame 50 (FIG. 1) to the circuit board 12 as described above. Thus, the present invention does not require any lateral force to maintain contact between the conductive bridge means 20 and the testing substrate 40, and the need for a spring-tensioned lead portion is obviated. Also, since the wires 30 in the conductive bridge means 20 do not project laterally, a laterally compact testing assembly 10 may be provided.

Also as mentioned above, the center portion, or "body", of conventional test clips must be sufficiently rigid to maintain the required lateral force. Since the circuit testing assembly 10 of the present invention does not require any lateral force to maintain electrical contact, the center portion 44 of the testing substrate 40 (FIG. 1) need not be rigidly constructed. For example, the center portion 44 of the testing substrate 40 may comprise a plurality of holes (not shown) for receiving a test probe.

Alternatively, the center portion 44 of the testing substrate 40 may comprise active components, a heat sink, or other elements. Furthermore, the center portion 44 of the testing substrate 40 may be completely removed.

As shown schematically in FIG. 3, each conductive wire 30 is spaced apart and electrically insulated from one another by embedding the wires 30 within the compressible, deformable insulating member 32. The centerline-to-centerline spacing, or distance "p", between the wires 30 is significantly smaller than the distance "q" between the integrated circuit leads 18. More specifically, "p" is preferably about 1/10 of "q". Thus, a plurality of wires 30 contact each individual integrated circuit package lead 18. As a result, electrical contact between each lead 18 and at least one of the wires 30 is ensured. Furthermore, misalignment of the bridge member 22 will not destroy the electrical contact between an integrated circuit package lead 18 and the testing substrate 40 since it is substantially certain that at least one of the wires 30 would still be in contact with the selected lead 18.

Referring again to FIG. 1, to maintain electrical contact with all of the integrated circuit package leads 18, the length "l" of each bridge member 22, 24, 26, 28 must be equal to or greater than the distance "d" of the particular row of integrated circuit package leads 18 associated therewith. It can thus be seen that, to correctly size a circuit testing device 10 to a particular integrated circuit package 14, the lead spacing and number of leads for the integrated circuit package 14 must be determined.

However, the circuit testing device 10 of the present invention is independent of other integrated circuit package characteristics such as package height, standard (EIAJ or JEDEC), stand-off height, or foot print. Thus, a particular circuit testing device 10 may be used on any integrated circuit package 14 with the same number of leads and lead spacing, regardless of differences in other characteristics.

Figure 4:
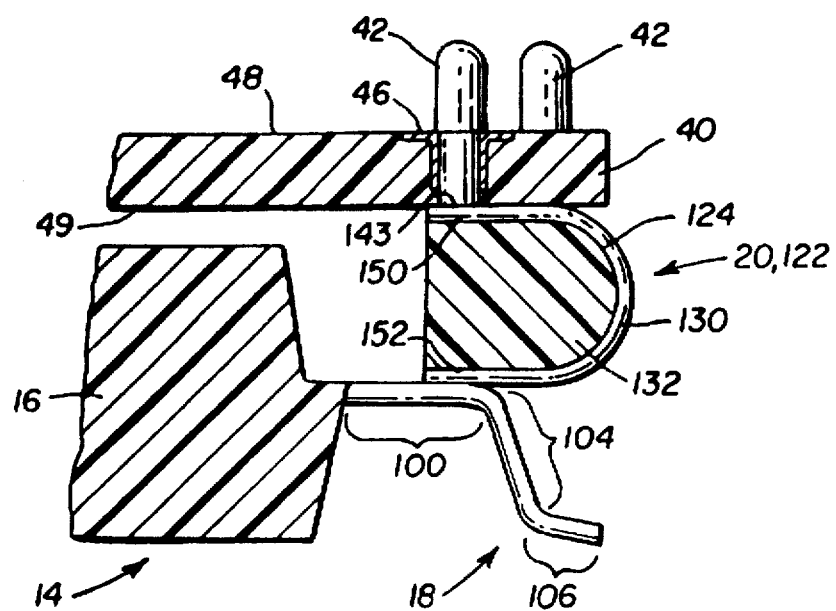
FIG. 4 is side, enlarged, sectional view of an integrated circuit package lead in association with another embodiment of the circuit testing assembly of FIG. 1.

FIG. 4 illustrates an alternative embodiment of the conductive bridge means 20 of FIGS. 1–3. Except where otherwise noted below, the invention of FIG. 4 is substantially identical to that described above with reference to FIGS. 1–3. As shown in FIG. 4, the conductive bridge means 20 may comprise at least one compressible bridge member 122. Each bridge member 122 preferably comprises a compressible insulating member 152 which may be substantially U-shaped in cross-section. The insulating member 152 may comprise a surface portion 124 having a plurality of substantially parallel, spaced-apart, electrically conductive wires 130 (only one shown). The wires 130 may be secured to the surface portion 124 with an adhesive or the like. For example, an adhesive layer (not shown) may be applied to the surface portion 124, and then the wires 130 may be positioned on the adhesive layer so that the wires 130 conform to the cross-sectional shape of the surface portion 124 as shown in FIG. 4. A first section 150 of each wire 130 may contact the bottom surface 143 of each conductive portion 42, and a second section 152 of each wire 130 may contact the first portion 100 of an integrated circuit package lead 18. As described above with reference to FIGS. 1–3, the second section 152 may alternatively contact another portion (e.g., portion 104 or 106) of the integrated circuit package lead 18. Electrical contact between the conductive portions 42 and the integrated circuit package leads 18 is maintained through the use of compressive force as described above with reference to FIGS. 1–3.

Figure 5:
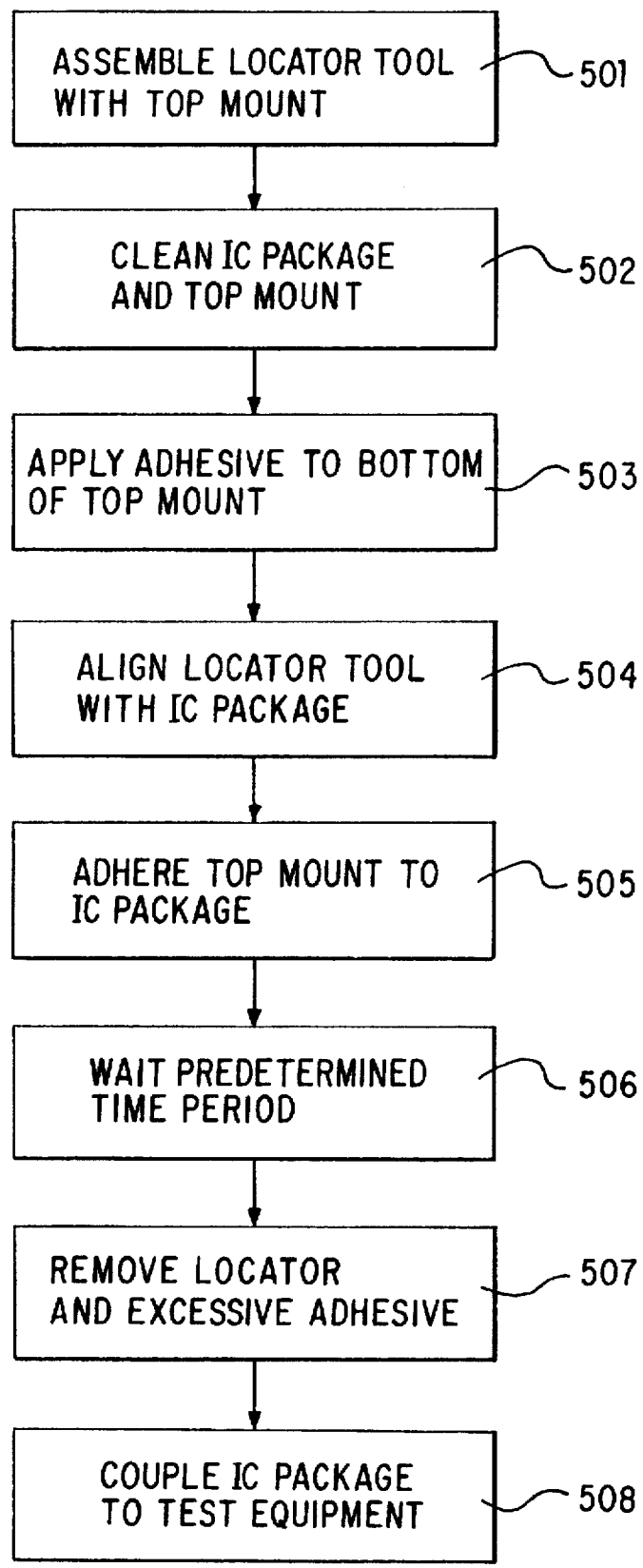
FIG. 5 shows a flow diagram of a preferred method for aligning and mounting a retainer to an integrated circuit package to facilitate testing using the circuit testing assembly of FIG. 1.

FIG. 5 shows a flow diagram of a preferred method for aligning and mounting a retainer to an integrated circuit package. A locator tool is first assembled via block 501. The locator tool comprises the locator (item 116 in FIG. 1b), the retainer (item 110 in FIG. 1b) and a knurled nut. The alignment pins of the retainer are aligned with apertures in the locator. The center stud, which is placed through the center aperture of the locator, is threaded to accept the knurled nut. At block 502, the top of the IC package and the bottom of the retainer (i.e., the surface opposite the surface having the major and minor posts) are cleaned. This cleaning may be performed with, for example, an isopropyl alcohol wipe or some similar cleaner.

Adhesive is then applied to the bottom of the retainer (block 503). In a preferred embodiment, the adhesive is an epoxy. Other adhesives, as well as double-sided tape, may be used without departing from the scope of the present invention.

The locator tool is then aligned with the IC package (block 504) using a conventional index symbol which can be as simple as an arrow indicator on top of the locator. At block 505, the locator tool is brought into contact with the IC package, using the guide teeth stubs to ensure alignment as the retainer, with the adhesive, is adhered to the top of the IC package. After waiting a predetermined time period (block 506) to permit the adhesive to dry, the locator is removed (block 507) and any excess adhesive is cleaned off the retainer and IC package. Finally, the IC package is hooked up to test equipment (block 508) via a probe pod. In a preferred embodiment, the probe prod is an "HP E5320A" general-purpose probe pod available from Hewlett-Packard Company, Palo Alto, Calif. The probe pod is aligned over the IC package and, using the center stud of the retainer, secured to the IC package using the knurled nut. This further ensures proper compressive forces in addition to the forces mentioned above with reference to FIGS. 1–4.

While the present invention has been illustrated and described in connection with the preferred embodiment, it is not to be limited to the particular structure shown. It should be understood by those skilled in the art that various changes and modifications may be made within the purview of the appended claims without departing from the true scope and spirit of the invention in its broader aspects.

For example, the locator may be formed with a number of guide teeth stubs being equivalent to the number of IC package leads. Another example would be to use double-sided tape in place of the adhesive.

What is claimed is:

1. A method for testing leads of an integrated circuit package on a circuit board, comprising:

(1) providing a circuit testing assembly comprising:
        i) a testing substrate comprising a plurality of conductive portions;
        ii) conductive bridge means for providing electrical contact between said leads of said integrated circuit package and said conductive portions of said testing substrate; and
        iii) a frame, connected to said testing substrate, said conductive bridge means positioned within said frame, said frame maintaining said conductive bridge means in electrical contact with said leads of said integrated circuit package and said conductive portions of said testing substrate, said conductive bridge means and said testing substrate being securely attached to said frame so that at least one of a plurality of wires in a bridge member is in contact with each of said conductive portions of said substrate;

(2) affixing a retainer to the top of said integrated circuit package;

(3) positioning said circuit testing assembly on said circuit board and over said integrated circuit package using said retainer as a guide; and (4) aligning said conductive bridge means with said leads of said integrated circuit package so that at least one of said wires in said bridge member of said conductive bridge means is in contact with each of said leads of said integrated circuit package.

2. The method of claim 1 comprising the further step of:

(5) mounting said circuit testing assembly to said circuit board by securing said circuit testing assembly to the retainer.

3. The method of claim 2, wherein step (2) further comprises the steps of:

(6) positioning said retainer within a locator;
    (7) securing said retainer to said locator with a nut;
    (8) adding adhesive to one side of said retainer; and
    (9) adhering said retainer to the top of said integrated circuit package.

* * * * *